United States Patent
Vuorinen

[11] Patent Number: 5,920,969
[45] Date of Patent: Jul. 13, 1999

[54] QUICK-FIXING ASSEMBLY FOR, E.G., A SWITCH DEVICE

[75] Inventor: Valto Vuorinen, Vaasa, Finland

[73] Assignee: ABB Control OY, Vassa, Finland

[21] Appl. No.: 08/973,962

[22] PCT Filed: Jun. 19, 1997

[86] PCT No.: PCT/FI96/00358

§ 371 Date: Feb. 17, 1998

§ 102(e) Date: Feb. 17, 1998

[87] PCT Pub. No.: WO97/01180

PCT Pub. Date: Jan. 9, 1997

[30] Foreign Application Priority Data

Jun. 21, 1995 [FI] Finland ..................................... 953116
Oct. 30, 1995 [FI] Finland ..................................... 955190

[51] Int. Cl.⁶ ............................... H02B 1/00; F16B 5/00
[52] U.S. Cl. .................................. 24/614; 24/590; 24/683
[58] Field of Search ............................. 24/614, 625, 666, 24/590, 662, 683, 295

[56] References Cited

U.S. PATENT DOCUMENTS

| | | |
|---|---|---|
| 2,537,750 | 1/1951 | Gretschel .................................. 24/590 |
| 3,789,176 | 1/1974 | Pick . |
| 3,858,996 | 1/1975 | Jarvis ....................................... 24/590 |
| 3,860,209 | 1/1975 | Strecker ................................... 24/590 |
| 4,599,768 | 7/1986 | Doyle et al. .............................. 24/590 |
| 4,852,224 | 8/1989 | Gentile et al. ............................ 24/590 |

FOREIGN PATENT DOCUMENTS

| | | |
|---|---|---|
| 0218803 | 4/1987 | European Pat. Off. . |
| 3233236 | 3/1984 | Germany . |

*Primary Examiner*—Victor N. Sakran

[57] ABSTRACT

The present invention is related to a fixing assembly for use in, e.g., a switch device, said assembly comprising a female element (10) in the first piece (21) to be connected and a male element (12) in the second piece (18) to be connected. According to the invention, the male element (12) is elongated and elastic and has its end (14) provided with at least one locking surface (15), and the female element (10) comprises at least one locking shoulder (11) and a corresponding widening recess (19) of the female element passageway for the purpose of permitting the entry of a locking surface (15) of the end (14) of the male element (12) to the rear of the locking shoulder (11) into a locking position by way of a twisting/untwisting motion.

11 Claims, 3 Drawing Sheets

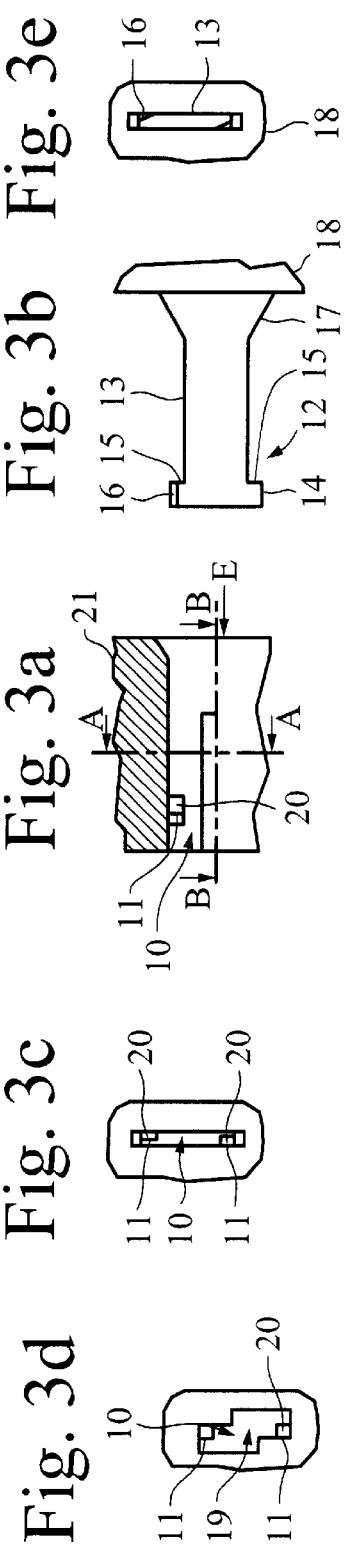

Fig. 5
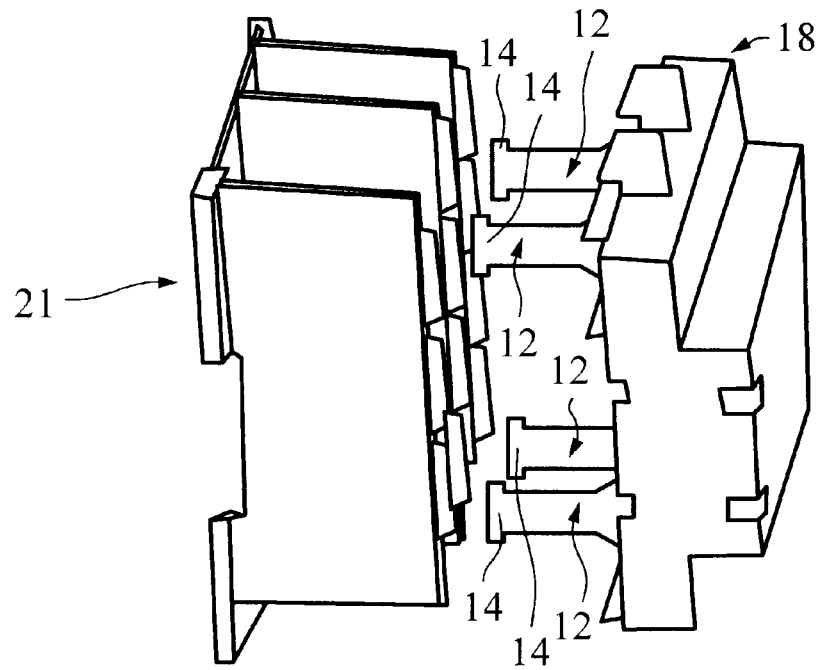
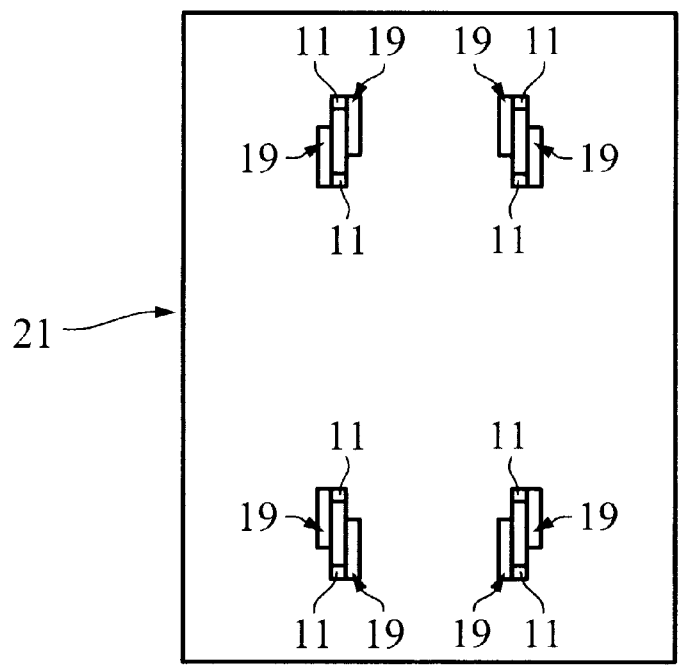
Fig. 6

5,920,969

QUICK-FIXING ASSEMBLY FOR, E.G., A SWITCH DEVICE

This application claims the benefit under 35 U.S.C. §371 of prior PCT International Application No. PCT/JPFI/00358 which has an International filing date of Jun. 19, 1997, which designated the United States of America, the entire contents of which are hereby incorporated by references.

The present invention is related to a fixing assembly for, e.g., a switch device according to the preamble of claim 1.

Conventionally, pieces are fixed to each other among other methods by means of, e.g., a screw connection formed by a screw plus a compatible inner thread on the counter piece. Also used is a bolt connection in which the nut is separate or a threaded insert is cast integral with the counter piece already in the mold. Further, a self-tapping screw can be used.

Quick-fixing can be implemented using, e.g., snap-action flat spring clips between which the piece to be fixed is clamped. Also known in the art are plastic clips designed to snap-lock against a mating surface with the help of backing surfaces.

The above-described techniques are hampered by a plurality of drawbacks. Screw connection is not preferred in series-production because of its time-consuming character. Moreover, accurate tolerancing is required to achieve suitable fixing tightness, since an excessively loose fixing may permit separation of the pieces while a too tight fixing may in turn overtorque the threads.

Both the spring and plastic clip fixing methods have the disadvantage of subjecting the fixing to a continuous bending stress due to the cantilever-type of clip leg tensioning which in the long run leads to fatigue of the spring/elastic material. The clips will release easily when the pieces are subjected to a separating pull force. In demanding fixings, spring and plastic clips can be opened too easily. While the grip of plastic clips can be improved through the use of steep angles on the mating surfaces of the snap connection, such a nearly perpendicular angle results in a disadvantageous end clearance.

Pieces may also be connected by ultrasonic welding, which requires substantial investments in machinery. Moreover, this method of connection necessitates maximum planarity and cleanness from the surfaces to be welded together. Due to wide quality variations, the strength of the welds cannot be estimated sufficiently accurately. Furthermore, the number of materials suitable for ultrasonic welding is limited.

It is an object of the present invention to overcome the drawbacks of the above-described fixing techniques and to provide an entirely novel type of fixing assembly suitable for use in, e.g., switch devices.

The goal of the invention is achieved by combining the fixing assembly from such a female element and a male element in which the male element is a flexible reed-like lug member adapted to twist about its longitudinal axis during the locking step and then returns back to its stress-free state at the completion of the locking step.

More specifically, the fixing assembly according to the invention is characterized by what is stated in the characterizing part of claim 1.

The invention offers significant benefits.

When locked, the leg of the male element is free from a twisting/bending stress. Provided that the number of symmetrical lug hooks is two, the leg of the male element will be subjected to a tensile stress alone under a pulling force separating the pieces from each other. The required amount of end clearance is close to zero even in a self-locking fixing assembly. The assembly according to the invention is also especially suitable for such a demanding fixing application in which the pieces must be positively fixed to each other. The fixing assembly requires no auxiliary parts and can be implemented in tight places. Pieces provided with the present fixing assembly are easy to assemble and when required can be made difficult to open. For the purpose of aiding the release step, the space reserved for unfixing with fingers can be designed larger as desired. The pieces will stay positively fixed without using an additional locking edge on the mating surfaces. The assembly according to the invention is also suitable for fixing metallic pieces if the fixing lug hooks are made from an elastic material. Finally, secured fixing can be readily verified visually.

In the following, the invention will be examined in more detail with the help of exemplifying embodiments by making reference to the attached drawings, in which:

FIGS. 3a–3j show a fixing embodiment according to the invention in different projections;

FIG. 4 shows an opening device suitable for releasing the fixing assembly according to the invention;

FIG. 5 shows a perspective view of the cover and body structures of a switch device incorporating the fixing assemblies according to the invention;

FIG. 6 shows in a rear view of the body part of a switch device provided with the female fixing elements according to the invention but without having the male fixing elements yet inserted.

Figure 1A:
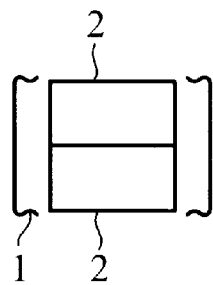
FIGS. 1a–1b show a fixing embodiment according to the prior art.
Figure 1B:
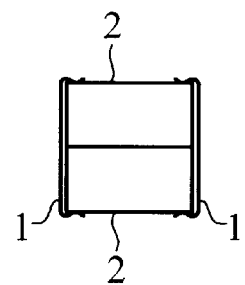

Referring to FIG. 1a, the embodiment shown therein has the conventional flat spring clips 1 still apart from the pieces 2 to be fixed. In FIG. 1b the clips 1 are shown placed fixing the pieces 2. As is evident from the latter diagram, the clips 1 remain under a continuous bending stress when mounted in place.

Figure 2A:
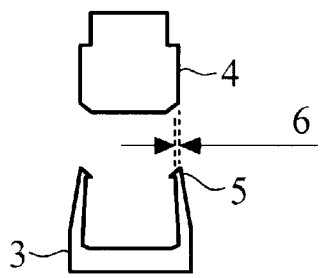
FIGS. 2a–2b show another fixing embodiment according to the prior art.
Figure 2B:
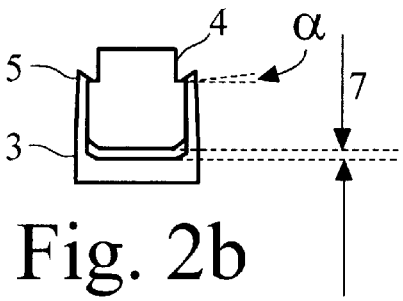

Referring to FIG. 2a, therein are correspondingly illustrated a plastic body piece 4 and a counter piece 3 forming a conventional fixing assembly based on hooked cantilever lugs 5 of the counter piece 3 and the preload tension 6 of the hooked lugs 5. The embodiment shown in FIG. 2b requires an end clearance 7. This is because the positive locking of the fixing assembly necessitates the use of a locking angle α greater than zero for the tips of the fixing lugs 5, whereby the insertion of the piece requires said end clearance 7. However, such an end clearance 7 degrades the rigidity of the fixing.

Referring to FIG. 3a, in the assembly according to the invention shown therein, the female element 10 is designed integral with the other piece to be fixed, which in the present case is a body piece 21. In the illustrated embodiment the female element 10 comprises a narrow and elongated passageway. The female element 10 has a width-to-height ratio of approx. 1:3–1:5 typical, advantageously approx. 1:4. To the top and bottom inner wall corners of the passageway forming the female element 10 shown in the diagram, at the opposite sides of the passageway, are made locking shoulders 11, whereby also corresponding widening recesses 19 of the passageway as shown in FIGS. 3f and 3d are made to the sides opposing said locking shoulders. In FIG. 3d is shown a section along line A—A of FIG. 3a. The widening recesses 19 have a width approximately equal to the basic width of the passageway in the female element 10. Acting as the male fixing element, the fixing lug 12 shown in FIG. 3b is inserted during the fixing step into the female fixing element 10, whereby the end 14 of the leg of the male fixing lug is twisted by the guide surfaces 20 of the locking shoulders 11, whereby the end 14 of the fixing lug is guided into the widening recesses 19 of the passageway in the manner shown in FIG. 3j. As the fixing lug 12 reaches its final locking position as shown in FIG. 3h, the locking surface 15 of the lug will be locked behind the shoulder 11 in a positive manner and the leg of the lug 12 can untwist back into the stress-free state as shown in FIG. 3i. The stress-free state is particularly attained in a design having two locking shoulders 11 and two locking surfaces 15. As is evident from the diagrams, the outside dimensions of the lug end 14 are essentially equal to the inside dimensions of the female element 10. It must be noted that FIGS. 3i and 3j are projections taken from direction D marked in FIG. 3h. In turn, FIG. 3h is a sectional view along direction C—C marked in FIG. 3i. In FIG. 3c the female element is viewed without the insertion of the male element from direction E marked in FIG. 3a. In FIGS. 3b and 3j are illustrated the bevels 16 that are provided to aid the insertion of the end 14 of the fixing lug 12 through the passageway of the female element 10. A precondition to the function of the present invention is that the leg 13 of the fixing lug 12 is be made sufficiently elastic to provide the required twisting action. To assure the strength of the fixing lug 12, the stem section 17 is designed wider than the elastic leg section 13. The stem section 17 joins with one of the pieces to be fixed together which in the illustrated case is the cover 18 of a switch device. When required, the locking can be assured by forming an angle α greater than zero to locking shoulder 11 and the locking surface 15 of the fixing lug. However, such an angle is not mandatory for the function of the embodiment according to the invention.

Referring to FIG. 4, an unlocking tool 22 is shown therein comprising finger surfaces 23 on which the opening force is imposed and a shaft 24 of the tool having unlocking tips 25 provided at the shaft end. The unlocking tool 22 is first inserted into the passageway so that the unlocking tips 25 are aligned on both sides of the end 14 of the fixing lug 12 and then the tool 22 is rotated and pushed, whereby the end 14 of the fixing lug 12 is guided past the locking shoulders 11 via the passageway widening recesses 19 out from the locking space. Referring to FIG. 5, the number of the fixing lugs 12 can be, e.g., four. In the illustrated embodiment, the fixing lugs 12 are permanently fixed to the cover 18 of the switch device, while the female elements 10 are correspondingly situated in the body piece 21. The ends 14 of the fixing lugs 12 extend inside the locking space approximately level with the rear surface of the body piece 21.

Referring to FIG. 6, a rear view of the body piece 21 is shown therein. In the illustrated structure both the locking shoulders 11 and the passageway widening recesses 19 formed at the shoulders are clearly visible in the female elements 10.

Figure 7:
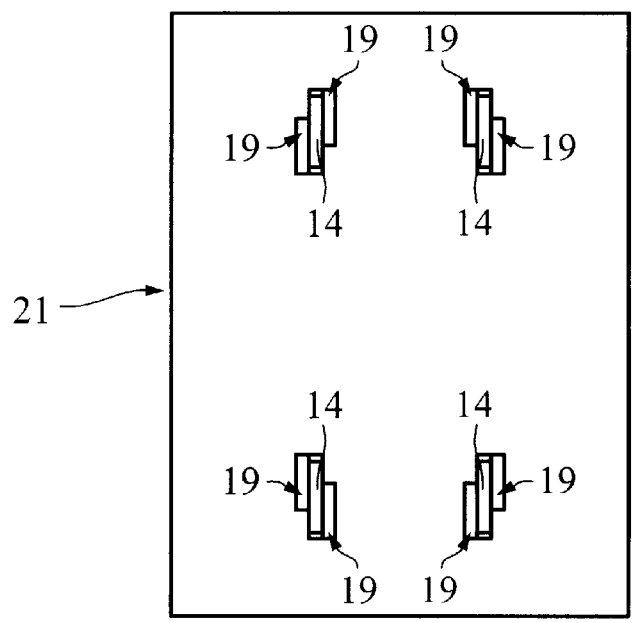
FIG. 7 shows the embodiment of FIG. 6 with the male fixing elements now inserted in place.

Respectively, in FIG. 7 the fixing lugs are shown inserted in place and the ends 14 of the fixing lugs are visible. The ends 14 of the fixing lugs are approximately level with the rear surface of the body piece 21.

Instead of the four fixing lugs 12 shown in the diagrams, two fixing lugs or other suitable number of the fixing assemblies can be used. An essential property to the function of the invention is the twisting and untwisting locking motion of the end 14 of the fixing lug, which permits the lug leg to assume a stress-free state in the locked position. Accordingly, also other cross-sectional shapes than a flat leg are possible for the fixing lug including a leg with a round section, too, if the material of the fixing lug leg is selected from the group of materials permitting a twisting motion. Hence, a leg with an annular cross section is feasible provided that the lug leg is designed to have sufficient flexibility.

According to the invention, the male element 12 may alternatively be integrated with the body piece 21, whereby the female element 10 is obviously integrated with the cover piece 18.

Without departing from the scope of the invention, the number of the locking shoulders 11 in each assembly can be only one, whereby also only one passageway widening recess 19 is needed.

In a typical embodiment of the invention, the pieces fixed together will not be dismounted any more, whereby the fixing method disclosed herein is an optimal solution. When a greater number of the present type of fixing assemblies are employed in a single housing construction, dismounting of the housing becomes complicated without the use of special tools, since each fixing assembly must be unlocked simultaneously. However, dedicated tools can be developed to accomplish this task.

The assembly according to the invention is typically made from a thermoplastic polymer, but thermosetting polymers and metals may also be used as the material of the assembly.

I claim:

1. A fixing assembly comprising:
   a female element including a passage formed therein open to an exterior surface thereof;
   a male element including a portion shaped to be receivable in said passage and being made from a torsionally flexible resilient material, said portion of said male element including at least one locking surface;
   wherein said passage includes a proximal portion into which said portion of said male element is initially received, and a distal portion including a locking shoulder protruding into said passage and being constructed and arranged to retainingly engage said at least one locking surface such that withdrawal of said portion of said male element from said passage is prevented, said locking shoulder being shaped to cause said portion of said male element to torsionally twist during insertion of said portion of said male element into said passage, such that insertion of said at least one locking surface of said portion of said male element past said locking shoulder allows said portion of said male element to resiliently untwist so as to place said at least one locking surface into retaining engagement with said locking shoulder.

2. The assembly according to claim 1, wherein said male element includes two locking surfaces and said distal portion of said passage includes two said locking shoulders arranged within said passage so as to cause said portion of said male element to torsionally twist until each said locking surface is inserted into said passage past said two locking shoulders, whereby said portion of said male element is free to untwist, thereby placing said two locking surfaces in retaining engagement with said two locking shoulders, respectively.

3. The assembly according to claim 2, wherein said two locking surfaces each include beveled portions for facilitating movement of said two locking surfaces past said two locking shoulders during insertion of said male element into said passage.

4. The assembly according to claim 2, wherein said two locking shoulders each include a guide surface for facilitating movement of said two locking surfaces past said two locking shoulders during insertion of said male element into said passage.

5. The assembly according to claim 2, wherein a portion of said passage adjacent said two locking shoulders is laterally wider than a proximal portion of said passage.

6. The assembly according to claim 1, wherein said at least one locking surface includes a beveled portion for facilitating movement of said at least one locking surface past said locking shoulder during insertion of said portion of said male element into said passage.

7. The assembly according to claim 1, wherein said locking shoulder includes a guide surface for facilitating movement of said at least one locking surface past said locking shoulder during insertion of said portion of said male element into said passage.

8. The assembly according to claim 1, wherein a portion of said passage adjacent said locking shoulder is laterally wider than a proximal portion of said passage.

9. The assembly according to claim 1, wherein said male element is at least partly made from one of thermosetting polymer, thermoplastic polymer, and metal.

10. The assembly according to claim 9, wherein said female element is at least partly made from one of thermosetting polymer, thermoplastic polymer, and metal.

11. The assembly according to claim 1, wherein said female element is at least partly made from one of thermosetting polymer, thermoplastic polymer, and metal.

* * * * *